United States Patent [19]

Melbye

[11] Patent Number: 4,762,766

[45] Date of Patent: Aug. 9, 1988

[54] DRY TRANSFER FILM WITH PHOTOSENSITIZED COLOR CARRYING LAYER AND PHOTOSENSITIZED PRESSURE SENSITIVE ADHESIVE LAYER WHEREIN PHOTOSENSITIZER IS O-QUINONE DIAZIDE

[75] Inventor: Kenneth M. Melbye, Scottsdale, Ariz.

[73] Assignee: Kroy Inc., Scottsdale, Ariz.

[21] Appl. No.: 818,796

[22] Filed: Jan. 14, 1986

[51] Int. Cl.[1] ............... G03C 1/60; G03C 1/54; G03C 1/90

[52] U.S. Cl. .................... 430/156; 430/166; 430/191; 430/192; 430/260; 430/261; 430/143; 430/257; 430/292; 430/293

[58] Field of Search .......... 430/260, 261, 156, 166, 430/162, 271, 273, 191, 192

[56] References Cited

U.S. PATENT DOCUMENTS

| | | | |
|---|---|---|---|
| 3,629,036 | 12/1971 | Isaacson | 430/260 |
| 3,649,283 | 3/1972 | Christensen et al. | 430/275 |
| 3,721,557 | 3/1973 | Inoue | 430/162 |
| 4,041,204 | 8/1977 | Hepher et al. | 428/199 |
| 4,168,978 | 9/1979 | Koenig | 430/260 |
| 4,217,407 | 8/1980 | Watanabe et al. | 430/156 |
| 4,226,927 | 10/1980 | Kinderman et al. | 430/14 |
| 4,260,673 | 4/1981 | Krech | 430/156 |
| 4,268,611 | 5/1981 | Okishi et al. | 430/166 |
| 4,292,392 | 9/1981 | Ikeda et al. | 430/162 |
| 4,329,384 | 5/1982 | Vesley | 430/260 |
| 4,389,473 | 6/1983 | Scrutton et al. | 430/260 |
| 4,389,480 | 6/1983 | Franke et al. | 430/260 |
| 4,504,566 | 3/1985 | Dueber | 430/156 |
| 4,571,374 | 2/1986 | Vikesland | 430/260 |
| 4,599,295 | 7/1986 | Kondo et al. | 430/260 |

Primary Examiner—Charles L. Bowers, Jr.
Attorney, Agent, or Firm—Dorsey & Whitney

[57] ABSTRACT

A dry transfer film and a method for preparing transfer characters therefrom in which the transfer film includes a carrier layer, a photosensitized color carrying layer disposed adjacent to the carrier layer and a photosensitized adhesive layer disposed adjacent to the color carrying layer. Both the color carrying and adhesive layers are photosensitive to certain respective wavelengths of the electromagnetic spectrum so that when exposed to such wavelengths, they become soluble in a respective solvent or solvents. The unexposed portions of these layers remain insoluble in such solvents.

5 Claims, 1 Drawing Sheet

DRY TRANSFER FILM WITH PHOTOSENSITIZED COLOR CARRYING LAYER AND PHOTOSENSITIZED PRESSURE SENSITIVE ADHESIVE LAYER WHEREIN PHOTOSENSITIZER IS O-QUINONE DIAZIDE

The present invention relates generally to a dry transfer film and method of preparing transfer characters from the same, and more particularly, to a dry transfer film and method utilized in the preparation of transfer letters and other characters for the purpose of transferring such characters to a desired medium.

BACKGROUND OF THE INVENTION

Several devices and technologies currently exist for transferring characters from a support or carrier sheet to a desired medium. Examples include press-on letters in which individual letters or other characters are formed onto a carrier sheet and then individually removed and transferred to the desired medium. These transfer letters have an adhesive back which permits them to be secured to the medium. A major drawback of this product is the difficulty in properly spacing and aligning the characters on the desired medium. Further, the creation of these characters usually involves a cutting or stamping process. Thus, the edge definition is normally not as good as desired.

Another product currently available contemplates the formation of images of letters or other characters directly onto a transparent, adhesive-backed film. This film is then removed from a carrier layer and secured to the desired medium in its entirety. Although this solves the problem of properly aligning and spacing the characters, the presence of the transparent film on the desired medium is undesirable in many applications.

A further product utilizes a photopolymerizable or cross-linkable film to produce negative images. In this system, selected portions of such film are exposed to various intensities of ultraviolet light. During this exposure, portions which have been exposed to the light source are polymerized or crosslinked by the induction of free radical polymerization. Portions which have not been polymerized or crosslinked are then washed off with an appropriate solvent, leaving behind the desired image of the polymerized material. A major problem with this system is that it requires a threshold of ultraviolet energy before the material will polymerize. Further, it can only be made as a negative system, in which the material forming the image is that which is exposed, unless very exotic chemistry is used.

In another system described in U.S. Pat. No. 4,226,927, a dry transfer element is disclosed which comprises a flexible carrier substrate having a release coating thereon and a photosensitive layer comprising a silver halide emulsion. In this system, the image is first created by exposure to a suitable light source, followed by development of the material with a tanning development agent for the purpose of hardening the gelatin in the emulsion and crosslinking the binder. This permits the nonhardened portion of the material to be removed with an appropriate solvent. In this system, an adhesive material is included in the silver halide emulsion or can be applied as a separate adhesive coating after the photographic layer has been developed and the relief image formed. Although this system overcomes some of the limitations of the other systems described above, it is quite complicated and requires several processing steps.

Accordingly, there is a need in the art for a dry transfer film which is capable of forming images of characters thereon for the purpose of transfer to a desired medium.

SUMMARY OF THE INVENTION

In accordance with the present invention, a transfer film or material is provided which enables the preparation of desired images or characters on a carrier or support sheet and the subsequent transfer of such characters to a desired medium. The transfer film of the present invention comprises a support or carrier material or substrate having release qualities, a photosensitized color carrying transfer layer and a photosensitized adhesive coating. The adhesive layer is also preferably provided with a protective coating to avoid the film sticking to unwanted places prior to use.

In the preferred embodiment, the color carrying transfer layer includes an ink or pigment component and a resin binder component which are photosensitized by a photosensitive material. The specific photosensitive material utilized is one which causes the color carrying layer to become highly soluble in an alkaline solution as a result of exposure to certain wavelengths of the electromagnetic spectrum, namely, ultraviolet light. With this property, portions of the color carrying layer can be preferentially exposed to such a light source, thus rendering the exposed material highly soluble to certain solvents or other developers. This permits the exposed material to be readily removed from the carrier sheet as a result of the solubility differential between the exposed and unexposed portions. Although it is contemplated that several photosensitizers can be utilized to accomplish the objectives of the present invention, the preferred embodiment contemplates a photosensitizer comprising the ortho-quinone diazides and specifically the ortho-naphthoquinone diazides. These compounds, as well as possible others, function in the present invention as a result of the difference in solubility created by the selected exposure thereof to certain wavelengths of ultraviolet light.

The transfer film of the present invention also includes an adhesive layer applied over the color carrying transfer layer. This adhesive layer is also photosensitized in the same manner as the transfer material. In other words, the adhesive layer is provided with sufficient photosensitive component so that when it is exposed to the ultraviolet light source (in a positive system), it will be rendered readily soluble in the developer solvent.

The product of the present invention also preferably includes a protective layer applied over the adhesive layer. This protective layer is not photosensitive, but is readily soluble in the solvent or other developing solution utilized in removing the exposed transfer material and adhesive.

The above described transfer film can be utilized in preparing transfer characters for transfer to a desired medium. To accomplish this, a mask containing the desired characters is placed adjacent to the transfer film. The film is then exposed to an appropriate source of ultraviolet light or other source of the wavelength to which the color carrying and adhesive layers are sensitive. During this exposure, the mask is disposed between the film and the light source. The mask prevents the character portions from exposure (in a positive system), but permits the remainder of the film to be exposed. The exposure causes the photosensitive color carrying and adhesive layers to become highly soluble in an alkaline developer solvent, thereby allowing the exposed portions to be readily removed from the carrier sheet. The unexposed character portions remain on the carrier sheet and can be transferred to the desired medium.

Accordingly, it is an object of the present invention to provide a dry transfer film for transferring images or characters from a carrier film to a desired medium.

Another object of the present invention is to provide a dry transfer film for transferring images of characters to a desired medium in which the process for forming the images is based upon the difference in solubility between portions which are exposed and not exposed to a selected light source.

Another object of the present invention is to provide a method of forming images of characters on a carrier sheet for transfer to a desired medium.

A still further object of the present invention is to provide a dry transfer film comprising a carrier layer with release qualities, a photosensitive color carrying transfer layer, a photosensitive adhesive coating and a non-photosensitive protective layer.

These and other objects of the present invention will become apparent with reference to the drawings, the description of the preferred embodiment and method and the appended claims.

DESCRIPTION OF THE PREFERRED EMBODIMENT AND METHOD

Figure 1:
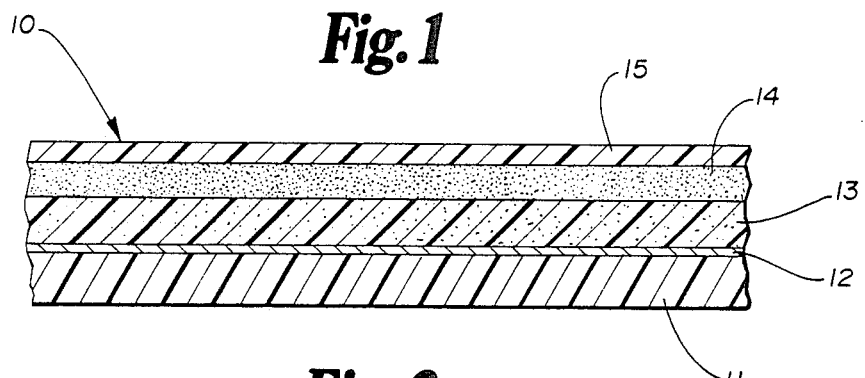
FIG. 1 is a sectional view of the dry transfer film in accordance with the present invention.
Figure 2:
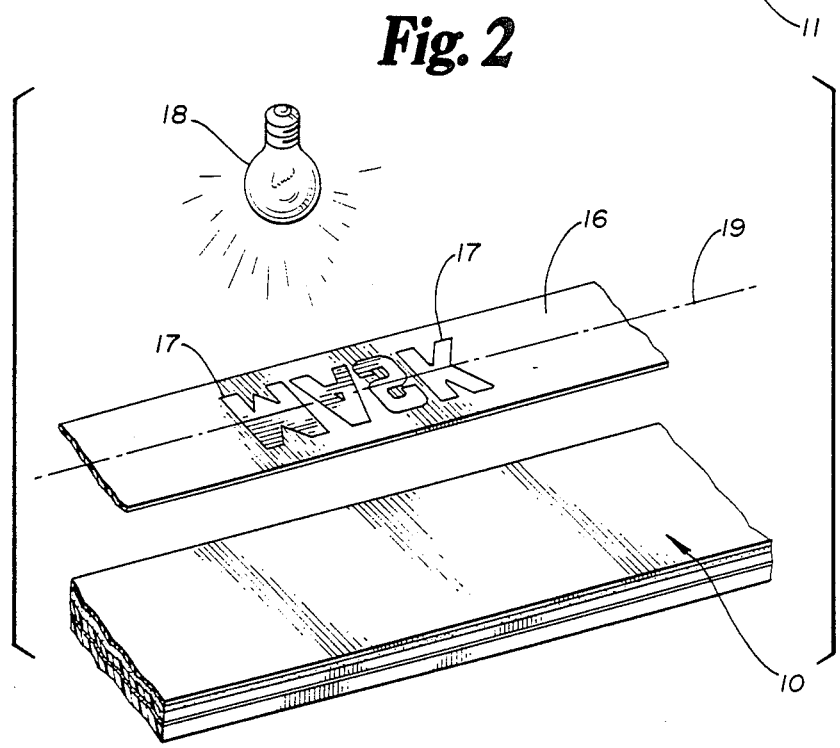
FIG. 2 is a pictorial, partially exploded view showing the mask suspended above the transfer film for clarity and the means for generating an image on the transfer film.

Reference is first made to FIGS. 1 and 2 illustrating the dry transfer film of the present invention and the procedure for generating images of characters thereon for the purpose of transfer to a desired medium. FIG. 1 is a cross-sectional view of a portion of the dry transfer film 10 of the present invention and includes a base material or carrier sheet 11, a release coating 12, a photosensitive color carrying layer 13, a photosensitive pressure sensitive adhesive layer 14 and a protective layer 15. As will be described in greater detail below, the base or carrier sheet 11 functions to support the color carrying or transfer layer 13 and associated adhesive layer 14. In the preferred embodiment, both the transfer layer 13 and the adhesive layer 14 are photosensitized by an appropriate sensitizier so that upon exposure of selected portions to certain wavelengths of the electromagnetic spectrum, namely, ultraviolet light, the transfer and adhesive layers 12 and 13 in the exposed areas are rendered highly soluble in a developing solvent. The protective layer 15 is not photosensitive, but is soluble in the same developing solvent in which exposed portions of the photosensitive layers are soluble. As a result, these exposed portions, as well as the entire protective layer 15, can be readily removed from the carrier 11 by appropriate scrubbing or washing with such developing solvent.

By utilizing the characteristics of such a photosensitizer to render ultraviolet light exposed portions soluble, a solubility differential is created in the color carrying and adhesive layers 13 and 14. This permits the selected exposure of portions of such layers to ultraviolet light and consequent removal from the carrier layer by an appropriate developer solvent.

In accordance with the preferred procedure of the present invention, this selective exposure of the transfer film to an ultraviolet light source, and thus the formation of the transfer characters, is accomplished by preparing a mask such as that identified by the reference numeral 16 in FIG. 2. This mask includes a plurality of characters 17 or other indicia thereon. During utilization of the dry transfer film of the present invention, the mask 16 is placed in face-to-face relationship with the transfer film 10 so that the characters 17 are as close to the photosensitive layers of the transfer film 10 as possible. To achieve the benefits of the present invention, the characters or other indicia 17 on the mask 16 should be formed of a material which is generally opaque to ultraviolet light so that the ultraviolet light from a light source 18 is unable to pass through the characters 17. The light source 18 is then activated to generate wavelengths of light to which the layers 13 and 14 have been sensitized. As a result, that portion of the transfer film 10 which has been so exposed is rendered highly soluble in an alkaline developing solvent and can be readily removed by immersing the film into the solvent and rubbing or wiping the same. This leaves an image of the characters 17 on the film for transfer to a desired medium.

With more specific reference to FIG. 1, the base or carrier sheet 11 can be constructed of any film or paper, however, the structure of the preferred embodiment contemplates a polyester film with a thickness of approximately 100 microns. Other thicknesses, however, will work, but the thickness of approximately 100 microns best balances the performance of the carrier layer 11 versus the cost. It is also helpful if the material from which the base or carrier sheet 11 is constructed is transparent. This aids in the placement of the formed image during application.

It is also preferable for the base or carrier sheet 11 to include some release qualities. By providing the sheet 11 with release qualities, control of the bond strength between the color carrying layer 13 and the base or carrier sheet 11 can be controlled. There are a number of techniques that can be employed to achieve the above-mentioned release quality. These are readily known by those skilled in the art. Some examples include silicone coatings, wax coatings and fluorocarbon coatings. The preferred structure, however, is to provide the carrier sheet 11 with a thin coating of polyethylene film 12. As with the carrier sheet 11, the thickness of this polyethylene film 12 can vary; however, the preferred structure contemplates that the thickness of this polyethylene film 12 should be about 19 microns. It has been found that the coating of polyethylene film provides a uniform and consistent release quality.

The color carrying layer 13 of the transfer film 10 is comprised of four basic ingredients: (1) a photosensitive sensitizer, (2) a resinous binder material, (3) a color producing pigment, dye and filler component and (4) an appropriate solvent.

The photosensitive sensitizer used in the color carrying layer 13 of the preferred embodiment can be any one of a variety of photosensitizers which are capable of creating a solubility differential in the color carrying layer 13 as a result of selected exposure certain wavelengths of the electromagnetic spectrum. In the preferred embodiment, this is an ultraviolet light source. The principal class of compounds falling into this category are those that undergo the "Wolff Rearrangement" upon exposure to certain wavelengths of ultraviolet light. Preferably these compounds are the quinone diazides in wich the double bonded $N_2$ is in the ortho position on the benzene ring relative to the double bonded oxygen. This group of compounds primarily includes the ortho-benzoquinone diazides and the ortho-napthoquinone diazides which are represented generally by the following formulas:

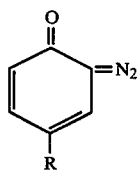

benzoquinone diazide

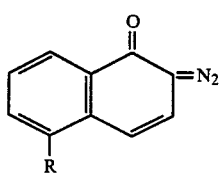

naphthoquinone diazide

In the above formulas, the letter "R" represents any number of chemical groups which are well-known and are cited in the literature. Changes in these chemical groups do slightly affect certain relevant properties of the subject ortho-quinone diazides. Properties which are slightly affected by change in the chemical group "R" include properties such as solvent solubility, light wavelength sensitivity, and adhesion to different materials and coatability.

As illustrated in the formula above for orthonaphthoquinone diazide, the "R" group is in the number 5 position (bonded to the number 5 carbon). It can, however, also be in the number 4 position and be equally effective as a sensitizer. As a result of the different possible structures and the different "R" groups that can be utilized, the sensitizing compound can be optimized for a variety of conditions. Examples of substituted orthon-aphthoquinone diazides which are acceptable as photosensitizers in accordance with the present invention are set forth as follows:

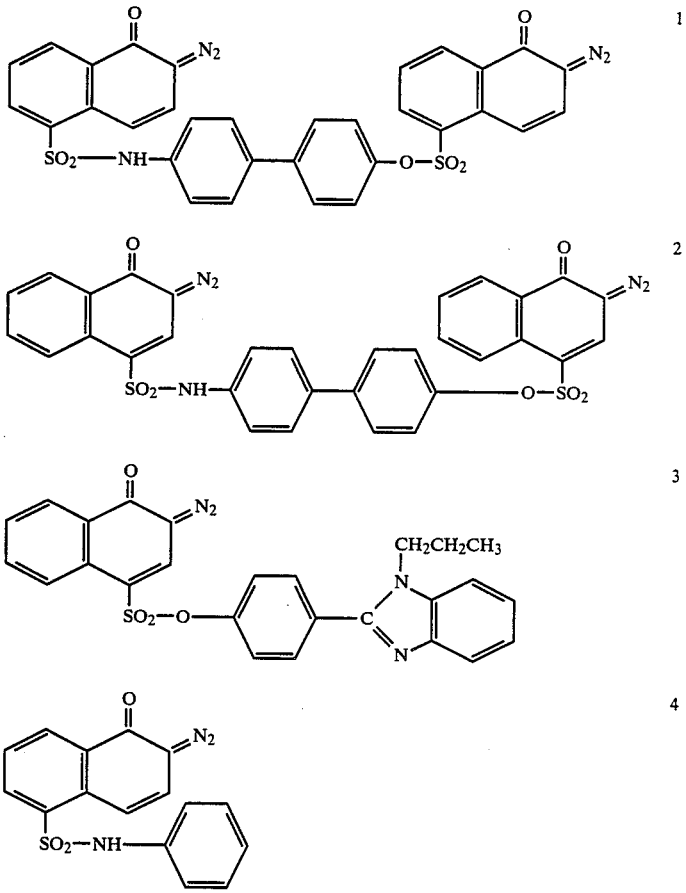

Other examples of photosensitive ortho-quinone diazides can be found in the literature. See, for example, Jaromir Koser, *Light Sensitive Systems Chemistry and Application of Nonsilver Halide Photographic Processes*, published by John Wiley & Sons, 1965 and William S. DeForest, *Photoresist: Materials and Processes*, published by McGraw-Hill, 1975, together with references cited therein.

The ortho-quinone diazides are reactive to ultraviolet light between wavelengths of approximately 350 and 420 nanometers. When exposed to ultraviolet light of these wavelengths, the ortho-quinone diazide undergoes a photolytic disassociation known as the "Wolff Rearrangement" and rearranges to form keto-carbene accompanied by the release of nitrogen. Upon formation, this ketocarbene immediately rearranges to form the more stable ketene structure illustrated in the reactive sequence below. This ketene structure immediately reacts with any water to form indenecarboxylic acid. The reactive sequence of an ortho-naphthoquinone diazide, upon exposure to ultraviolet light, is set forth as follows:

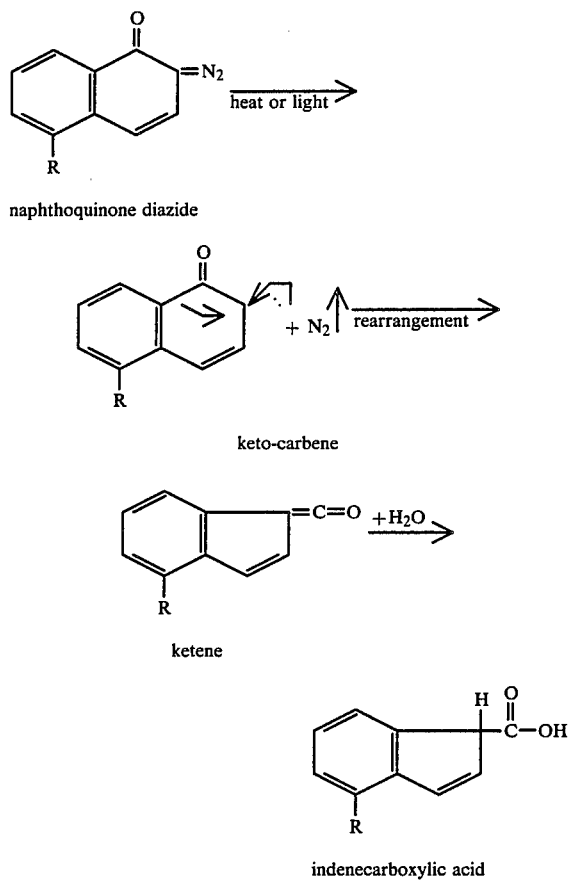

naphthoquinone diazide keto-carbene ketene indenecarboxylic acid

As a result of the above described properties and characteristics of the ortho-quinone diazides, a solubility differential is created between portions of the photosensitized color layer 13 which are exposed and portions which are unexposed to the appropriate wavelengths of ultraviolet light. Specifically, a solubility difference is created between the unexposed ortho-quinone diazide and the indenecarboxylic acid formed as a result of exposure to ultraviolet light. In general, any basic or alkaline solution will dissolve the indenecarboxylic acid (the exposed portion) while the ortho-quinone diazide (the unexposed portion) is essentially insoluble in such a solution. Thus, by exposing the photosensitized color carrying layer 13 to an appropriate source of ultraviolet light through the mask 16, a solubility differential is created between exposed and unexposed areas. The exposed areas, which have become alkaline soluble, can then be dissolved away in an appropriate alkaline developer solution, leaving only the unexposed area on the base or carrier sheet 11. This unexposed area which is not soluble in the developer solution and which remains on the carrier sheet 11 is in the form of the image of the characters 17.

The resinous or binder material component of the color carrying layer 13 is comprised generally of alkaline soluble polymers such as novolacs, resols, polyvinyl phenols and acrylics. Virtually any alkaline soluble polymer, or combination thereof, will function for the purpose intended in the present invention as long as they are compatible with the particular photosensitizer being utilized and provide the desired release ability from the carrier layer 11. In the preferred embodiment of the present invention, the resinous or binder material component is comprised of a combination of an acrylic resin known as Carboset 525, manufactured by B. F. Goodrich and a phenolformaldehyde novolac resin known as Thordurite SD-1754 manufactured by Borden Chemical of Columbus, Ohio. The Carboset 525 component in the above preferred composition was chosen because of its ability to release from the polyethylene coated carrier layer 11 and the Thordurite SD-1754 was chosen because of its speed of dissolution in an alkaline solution.

A further desirable feature of the binder material is a high elongation factor. The elongation factor relates to the tensile strength of the resinous material. Resins which are somewhat rubbery and have good elongation tend to aid in the transfer of the image to the receiver surface. For example, if some areas are missed by application of the localized pressure during transfer to the receiver surface, the tensile strength and elongation of the rubbery resin overcomes the bond strength between the carrier sheet 11 and the color coating 13, thereby causing the image to adhere to the receiver surface even though the bond was not broken between the carrier sheet and the color coat. The Carboset 525 component mentioned above has a high elongation factor and thus exhibits good release characteristics.

The dyes and pigments are included in the composition forming the color carrying layer 13 to give an image having a desired color. The specific dyes and pigments are chosen primarily on their visible appearance when coated, as well as their compatibility with the specific photosensitive component and resin system being used. The dye or pigment should also readily transmit ultraviolet light. Dyes and pigments which tend to absorb ultraviolet light of a wavelength to which the ortho-quinone diazide or other sensitizer is sensitive, essentially reduces the sensitivity of the film to such light, therefore requiring more ultraviolet light energy to achieve the proper exposure.

The preferred formula for the color carrying layer 13 in accordance with the present invention is as follows:

| Preferred Formula (Color Carrying Layer) | | |
|---|---|---|
| Component | % by Wt. Range | % by Wt. Preferred |
| Positive Photosensitive Sensitizer 1011 (an ortho-naphthoquinone diazide from Fairmont Chemical of Newark, NJ) | 2–5% | 3.9% |
| Phenolformaldehyde novolac resin Thordurite SD - 1754 (from Borden Chemical of Columbus, OH) | 8–15% | 10.46% |
| Acrylic resin Carboset 525 (from B.F. Goodrich of Akron, OH) | 8–15% | 10.0% |
| Black dye Morefast 108 (from Morton Chemical Co. of Chicago, IL) | 1.9–6% | 1.96% |

-continued

| Preferred Formula (Color Carrying Layer) | | |
|---|---|---|
| Component | % by Wt. Range | % by Wt. Preferred |
| Solvent Methyl Ethyl Ketone | 80.1–59% | 73.6% |

The above formula identifies the preferred weight percentage of each of the components of the color carrying layer composition as well as the acceptable range of weight percentage for each component. It is not intended, however, that these preferred percentages or ranges (or those in formulas set forth below) be limiting, but that they merely illustrate what is preferred. To prepare the color carrying layer 13, each of the components in the above preferred formula are dissolved in the methyl ethyl ketone or other appropriate solvent. Following this, the solution is applied to the polyethylene coated side of the carrier sheet 11 by conventional coating methods. The coated sheet is then dried in an oven. The coating thickness of the color coating layer 13 is between approximately 4 and 9 microns, although thicker or thinner coatings can be made. The preferred thickness of the color coating layer 13 is between about 6 and 6.4 microns.

The adhesive coating portion 14 of the transfer film 10 is comprised of a photosensitive sensitizer, a pressure sensitive adhesive with minor additives and an appropriate solvent. In the preferred embodiment, the photosensitive sensitizer used in the adhesive coating is the same sensitizer used in preparing the color coating layer 13 described above, namely, an ortho-naphthoquinone diazide. It is not required, however, that the same sensitizer be utilized. Although the color coating layer 13 and the adhesive layer 14 can contain different photosensitizers, or combinations of photosensitizers, it is preferable for such photosensitizers to be sensitive to similar wavelengths of ultraviolet light. This avoids the necessity of exposing the film to different wavelength bands of light or multiple exposures. The sensitizers for the color carrying layer 13 and adhesive layer 14 can, however, be sensitive to different wavelengths and still achieve the benefits of the present invention. It is also possible for the sensitizer utilized in the adhesive layer to render the exposed portion of such layer soluble in a solvent other than that to which the color carrying layer is exposed. However, the sensitizers are preferably selected so that the exposed portions of the color carrying layer 13 and adhesive layer 14 are soluble in the same solvent.

The pressure sensitive adhesive component of the adhesive layer should preferably include those pressure sensitive adhesives which require some alkaline or water solubility. The preferred adhesive component of the present invention is a pressure sensitive adhesive referred to as PPR 133 manufactured by Fairmont Chemical Company. This particular adhesive is an acrylic vinyl acetate copolymer. An adhesive referred to as PPR 132 and manufactured by Fairmont Chemical Company can also be utilized although it is not as fast acting as the preferred adhesive PPR 133.

A minor amount of a further adhesive is also preferably added in the present embodiment to increase the speed of development (or dissolution) of the adhesive coat in the alkaline solution. Specifically, this additional adhesive is an acrylic resin referred to as Carboset 515 manufactured by B. F. Goodrich.

The preferred formula including the preferred percentage of each of the components (by weight) as well as the preferred acceptable range of percentages of each of the components (by weight) is set forth in the table below:

| Preferred Formula (Adhesive Coating) | | |
|---|---|---|
| Component | % by Wt. Range | % by Wt. Preferred |
| Positive Photosensitive Sensitizer 1011 (an ortho-naphthoquinone diazide from Fairmont Chemical) | 4–6% | 6.14% |
| PPR 133 acrylic pressure sensitive adhesive (from Fairmont Chemical) | 38–55% | 45.02% |
| Acrylic resin Carboset 515 (from B.F. Goodrich) | .5–1.5% | 1.26% |
| Solvent Toluene | 57.5–35.5% | 47.58% |

The components of the above described adhesive coating are dissolved in the tolulene or other appropriate solvent and then coated over the previously coated color coating 13 by conventional coating methods. The coating is then dried in an oven. Preferably the coating thickness of the adhesive coating 14 should be about 4 to 9 microns, although thicker and thinner adhesive coats can be made to work as well. It is estimated that a thickness of about 7 microns is preferred.

To prevent the adhesive coating 14 from sticking to equipment and other materials and to facilitate handling of the transfer film, a protective coating 15 is applied over the entire adhesive coating 14. This coating 15 should preferably dissolve readily in the alkaline solution or other developing solvent which is utilized to remove the exposed portions of the color coating layer 13 and the adhesive layer 14. It should also preferably be tack free to the touch after it is applied to the adhesive coating and permeable to nitrogen gas since this is what is given off during the ultraviolet light exposure process.

Many resins and other materials can be utilized in preparing the protective coating 15. Examples include Neocryl BT-175 (a waterborne acrylic copolymer resin manufactured by Polyvinyl Chemical Industries Beatrice Chemical Co. of Wilmington Mass., polyvinyl alcohols, Vinac ASB-156 (a vinyl acetate copolymer manufactured by Air Products of Allentown Pa.) and Zinpo 1 0V-101 (a styrene acrylic polymer manufactured by Zinchem, Inc. of Summers N.J. The preferred formulation of the protective coating is as follows:

| Preferred Formula (Protective Coating) | |
|---|---|
| Component | % by Wt. Preferred |
| Zinpol OV-101 styrene acrylic polymer emulsion | 67.0% |
| Water | 33.0% |

The protective coating in accordance with the formula above is mixed and applied to the entire surface of the adhesive coating by conventional means and then dried in an oven. The thickness of the protective coating should be as thin as possible, but still capable of producing a product which is tack free and easy to handle.

After the above-mentioned coatings 13, 14 and 15 have been applied to the carrier layer 11, the film can be slit into whatever width and length are desired or it can be retained in sheet form. It can also be prepared in a strip form and provided on a roll.

Having described the detailed structure of the transfer film 10, the transfer images or characters can be prepared by selective exposure of portions of the film to certain wavelengths of ultraviolet light and subsequent washing in an appropriate developer solvent. As described above, the color coating layer 13 and the adhesive layer 14 which are exposed to certain wavelengths of ultraviolet light will undergo what is known in the art as the "Wolff rearrangement". As a result, these exposed portions will be rendered highly soluble in various alkaline solvents. Although different sensitizers will be sensitive to different wavelengths of light, the ortho-quinone diazides and in particular the orthonaphthoquinone diazides of the preferred embodiment are reactive to ultraviolet light between 350 and 420 nanometers. In the preferred method, the developer solution comprises a solution of alkaline salts, surfactants and wetting agents, defoamers and small amounts of other solvents. The preferred developer solution in accordance with the present invention is set forth as follows:

| Preferred Formula (Developer Solution) | | |
|---|---|---|
| Component | % by Wt. Range | % by Wt. (Preferred) |
| Sodium metasilicate | .25-1% | .5% |
| Trisodium phosphate | 1-4% | 2.0% |
| Alipah CO-433, a sodium salt of sulfated alkylphenoxypoly (ethyleneoxy)-ethanol (manufactured by GAF of Wayne, NJ) | 1-3% | 2.0% |
| Defoamer L-457 (manufactured by Drew Chemical of Boonton, NJ) | .25-.75% | .5% |
| Benzyl alcohol | .1-.6% | .25% |
| Water | 97.4-90.65% | 94.75% |

As described above, the mechanism which causes the system of the present invention to work is based on the solubility differential created by the ortho-naphthoquinone diazide or other sensitizer when it is preferentially exposed to certain wavelengths of ultraviolet light. Thus, any sensitizer capable of creating such a solubility differential will function in accordance with the teachings of the present invention.

To prepare transfer characters or other indicia for transfer to a desired medium, the transfer film 10 is first prepared. In accordance with the present invention, this is accomplished by first coating a photosensitized color carrying layer 13 onto a base or carrier sheet 11. Preferably, this carrier sheet 11 is provided with release qualities such as the release coating 12. Next, a photosensitized layer of adhesive material 14 is applied to the outer surface of the color carrying layer 13. Finally, a protective coating 15 which is readily soluble in the developing solution is applied over the entire adhesive coat 14.

To prepare the transfer characters from this film, a mask 16 having the desired characters 17 thereon is placed next to the transfer film so that preferential exposure to an ultraviolet light source can occur. Preferably, the characters 17 are placed adjacent to the protective coating or as close to the surface of the color carrying layer 13 as possible. The mask 16 is positioned relative to the film 10 by rotating the mask 16 180° about the axis 19 extending through the line of type. This is illustrated best in FIG. 2. The transfer film 10, with the mask 16 adjacent thereto, is then exposed to a source of ultraviolet light for a period of time sufficient to cause the above described photolytic reactions to occur. This will depend on the wattage of the light source and the particular type of light source. In the preferred embodiment and method of the present invention, using orthonaphthoquinone diazides, the exposure time should be approximately 30-180 seconds when exposed to a 15 watt fluorescent bulb and the wavelength of light should be approximately 350 to 420 nanometers. Mercury vapor lamps and xenon flash can also be used as the light source.

Following this exposure, the mask is removed and the transfer film is immersed in or exposed to the developer solution. When this occurs, the protective coating covering the entire adhesive layer is first dissolved. Next, the exposed portion of the adhesive layer 14 swells and softens, allowing the developer solution to selectively pass through the exposed portion of the adhesive coating. This in turn allows the exposed portions of the color coating layer 13 to dissolve in the developer solution. Once the exposed portions of the adhesive layer 14 and color coating layer 13 have been sufficiently dissolved and softened by the developer solution, light rubbing will remove those portions from the transfer film 10. In the preferred method, immersion of the transfer film in the developer solution is required for approximately 30-40 seconds in order to fully soften and dissolve the exposed portions of the adhesive and color coating layers 14 and 13, respectively. The exact time, however, will vary depending upon the thickness of the adhesive and color coating layers, the sensitizer being utilized and various other factors.

Figure 3:
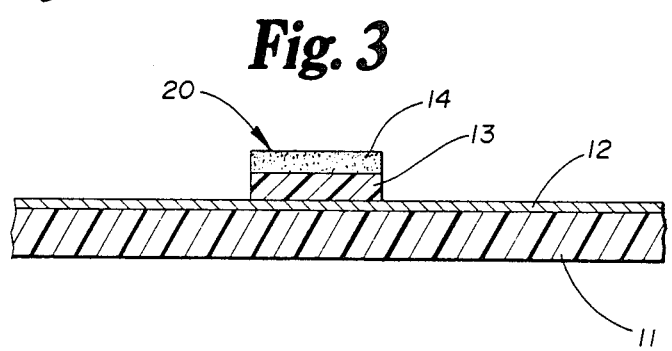
FIG. 3 is a sectional view of a portion of an image formed on the transfer film with the exposed portions of the transfer material having been removed.

After the exposed portions of the adhesive layer and the color coating layer have been removed, the unexposed indicia or characters (illustrated generally in FIG. 3 by the refrence numeral 20) remain on the carrier sheet 11. The adhesive layer 14 on each of these characters 20 is exposed because the protective coating 15 (FIG. 1) has been totally removed as a result of immersion in the developer solution. At this point, the prepared transfer images or characters 20 can be applied to a desired medium by placing the adhesive layer 14 in contact with the desired medium. This is accomplished by first aligning the characters as desired and then physically transferring the characters to the medium by rubbing the back side of the carrier sheet 11 with the tip of a ballpoint pen, a stylus or some other similar tool. This rubbing action activates the pressure sensitive adhesive in the adhesive layer 14 and causes the character 20 to adhere to the desired medium and be released from the release coating of the carrier sheet 11.

Although the description of the preferred embodiment and method have been quite specific, it is contemplated that various modifications could be made without deviating from the spirit of the present invention. Accordingly, it is intended that the scope of the present invention be dictated by the appended claims rather than by the description of the preferred embodiment and method.

I claim:

1. A dry transfer film facilitating the formation of characters or the like and the transfer thereof to a receiving substrate, said transfer film comprising:
   a carrier layer having release characteristics;
   a photosensitized color carrying layer disposed adjacent to said carrier layer, said color carrying layer containing in mixture a color producing pigment and a photosensitizer component comprising an orthoquinone diazide in a quantity sufficient to alter the solubility of portions of said color carrying layer in a developer solvent as a result of exposure thereof to selected wavelengths of the electromagnetic spectrum, the quantity of said photosensitizer component being such that said color carrying layer is generally insoluble in said developer solvent except when exposed to said selected wavelengths;

a photosensitized pressure sensitive adhesive layer disposed adjacent to said color carrying layer, said adhesive layer containing in mixture a pressure sensitive adhesive and a photosensitizer component comprising an orthoquinone diazide component in a quantity sufficient to alter the solubility of portions of said adhesive layer in said developer solvent as a result of exposure thereof to said selected wavelengths, the quantity of said photosensitizer component being such that said adhesive layer is generally insoluble in said developer solution except when exposed to said selected second wavelengths, said carrier layer having release characteristics and said adhesive layer having adhesive characteristics such that the bonding force between said adhesive layer and the receiving substrate is greater than the bonding force between said color carrying layer and said carrier layer thereby facilitating the transfer of the non-exposed portions of said color carrying and adhesive layers from said carrier layer to the receiving substrate; and a protective layer disposed adjacent to said adhesive layer, said protective layer being soluble in said developer solvent.

2. The transfer film of claim 1 wherein said selected wavelengths are in the ultraviolet range.

3. The transfer film of claim 8 wherein said selected wavelengths range between about 350 and 420 nanometers.

4. The transfer film of claim 1 wherein said carrier layer includes a release coating and said photosensitized color carrying layer is disposed adjacent to said release coating.

5. The transfer film of claim 1 wherein said color carrying layer includes a component comprising an alkaline soluble polymer.

* * * * *